(12) United States Patent  
Chen et al.

(10) Patent No.: US 9,368,379 B2  
(45) Date of Patent: Jun. 14, 2016

(54) SYSTEMS AND METHODS OF CONTROLLING SEMICONDUCTOR WAFER FABRICATION PROCESSES

(75) Inventors: Shih-Hung Chen, Zhubei (TW); Ying Xiao, Zhubei (TW); Chin-Hsiang Lin, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 644 days.

(21) Appl. No.: 13/419,952

(22) Filed: Mar. 14, 2012

(65) Prior Publication Data

US 2013/0245978 A1    Sep. 19, 2013

(51) Int. Cl.
| | | |
|---|---|---|
| *G06F 15/00* | (2006.01) | |
| *G01B 11/26* | (2006.01) | |
| *H01L 21/67* | (2006.01) | |
| *H01L 21/68* | (2006.01) | |
| *H01L 21/687* | (2006.01) | |

(52) U.S. Cl.
CPC ........ H01L 21/67259 (2013.01); H01L 21/681 (2013.01); H01L 21/68764 (2013.01)

(58) Field of Classification Search
CPC ............ H01L 21/6831; H01L 21/6833; H01L 21/67259; H01L 21/67201; H01L 21/68742; H01L 21/67748
USPC ....................................... 702/82, 40; 118/715
See application file for complete search history.

(56) References Cited

U.S. PATENT DOCUMENTS

| 6,197,117 B1* | 3/2001 | Li et al. .......................... 118/715 |
| 7,596,425 B2* | 9/2009 | Asa ................................ 700/213 |
| 2003/0033116 A1* | 2/2003 | Brcka et al. .................... 702/182 |
| 2005/0081790 A1* | 4/2005 | Konishi et al. ............. 118/723 R |
| 2009/0279989 A1* | 11/2009 | Wong et al. .................... 414/217 |
| 2011/0161014 A1* | 6/2011 | Kim et al. ....................... 702/40 |

FOREIGN PATENT DOCUMENTS

| JP | 61-170605 A | 8/1986 |
| JP | 10-214876 | 8/1998 |
| JP | 2005-26667 | 1/2006 |
| KR | 2001-0022016 | 3/2001 |

(Continued)

OTHER PUBLICATIONS

Official Action issued Nov. 15, 2013 in counterpart KR patent application No. 10-2012-0077674.

(Continued)

*Primary Examiner* — Lam Nguyen
(74) *Attorney, Agent, or Firm* — Duane Morris LLP

(57) ABSTRACT

A system and method of controlling a semiconductor wafer fabrication process. The method includes positioning a semiconductor wafer on a wafer support assembly in a wafer processing module. A signal is transmitted from a signal emitter positioned at a predetermined transmission angle relative to an axis normal to the wafer support assembly to check leveling of the wafer in the module, so that the signal is reflected from the wafer. The embodiment includes monitoring for the reflected signal at a predetermined reflectance angle relative to the axis normal to the wafer support assembly at a signal receiver. A warning indication is generated if the reflected signal is not received at the signal receiver.

19 Claims, 13 Drawing Sheets

(56) References Cited

FOREIGN PATENT DOCUMENTS

KR 10-2006-0002524 1/2006
WO 9905703 A1 2/1999

OTHER PUBLICATIONS

Official Action issued May 22, 2014 in counterpart KR patent application No. 10-2012-0077674.

Official Action issued Feb. 13, 2015 in counterpart Taiwan patent application.

Quirk, M., "Semiconductor Manufacturing Technology", Prentice Hall, 2001, p. 133.

Official Action issued Jan. 15, 2016 in counterpart KR patent application No. 201210229433.5.

* cited by examiner

SYSTEMS AND METHODS OF CONTROLLING SEMICONDUCTOR WAFER FABRICATION PROCESSES

FIELD OF THE INVENTION

The present disclosure is directed generally to semiconductor wafer fabrication processes and more particularly to systems and methods to control semiconductor wafer transfer.

DESCRIPTION OF THE RELATED ART

Integrated circuits are produced by a plurality of semiconductor processes in a semiconductor wafer fabrication facility. These processes, and associated fabrication tools, may include thermal oxidation, diffusion, ion implantation, rapid thermal processing (RTP), chemical vapor deposition (CVD), physical vapor deposition (PVD), epitaxy formation/growth processes, etch processes, photolithography processes, and/or other fabrication processes and tools. Wafer handling systems accept semiconductor wafers from factory materials handling systems and align the wafers for subsequent processing. Wafers may be aligned and mapped or located in a load lock. The wafer handling systems utilize robotic mechanisms that conventionally have a robotic blade at an end of a robotic arm to transfer the wafers between wafer cassette modules, loadlock chambers, transfer modules and various process or reaction chambers.

BRIEF DESCRIPTION OF THE DRAWINGS

Various aspects of the present disclosure will be or become apparent to one with skill in the art by reference to the following detailed description when considered in connection with the accompanying exemplary non-limiting embodiments.

DETAILED DESCRIPTION OF THE EXAMPLES

Figure 1:
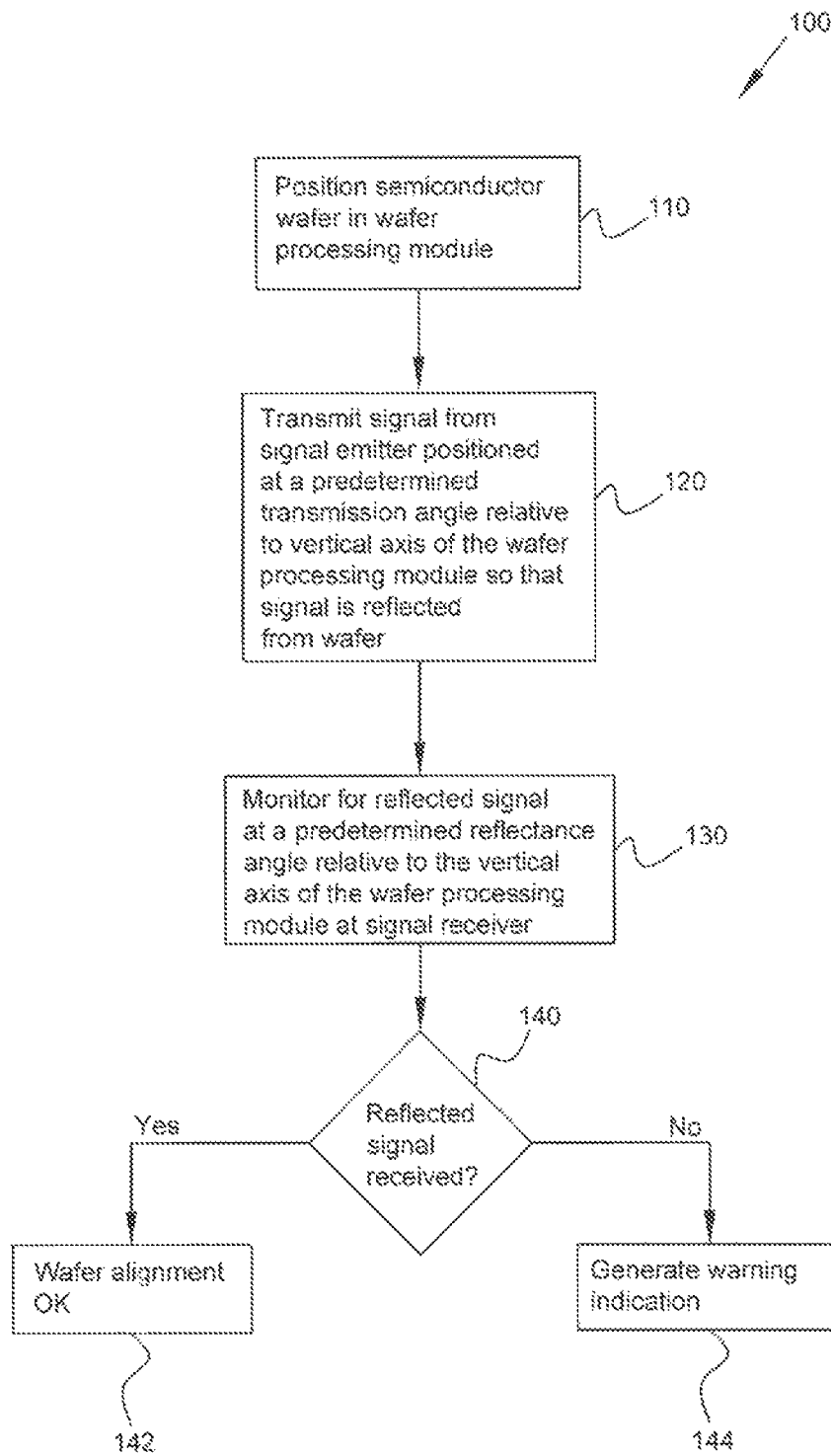
FIG. 1 is a flow chart illustrating a method of controlling a semiconductor wafer fabrication process according to embodiments of the present disclosure.

With reference to the Figures, where like elements have been given like numerical designations to facilitate an understanding of the drawings, the various embodiments of a system and a method of controlling a semiconductor wafer fabrication process are described. The figures are not drawn to scale.

The following description is provided as an enabling teaching of a representative set of examples. Those skilled in the art will recognize that many changes can be made to the embodiments described herein while still obtaining beneficial results. It will also be apparent that some of the desired benefits discussed below can be obtained by selecting some of the features or steps discussed herein without utilizing other features or steps. Accordingly, those who work in the art will recognize that many modifications and adaptations, as well as subsets of the features and steps described herein are possible and may even be desirable in certain circumstances. Thus, the following description is provided as illustrative and is not limiting.

This description of illustrative embodiments is intended to be read in connection with the accompanying drawings, which are to be considered part of the entire written description. In the description of embodiments disclosed herein, any reference to direction or orientation is merely intended for convenience of description and is not intended in any way to limit the scope of the present invention. Relative terms such as "lower," "upper," "horizontal,", "vertical,", "above," "below," "up," "down," "top," "normal" and "bottom" as well as derivative thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation. Moreover, various features and benefits are illustrated by reference to the exemplary embodiments. Accordingly, the subject matter of this disclosure and the appended claims are expressly not limited to such preferred embodiments.

As used herein, use of a singular article such as "a," "an" and "the" does not exclude pluralities of the article's object unless the context clearly and unambiguously dictates otherwise.

Proper wafer leveling is important at various stages of wafer transfer and processing. For example, reaction chambers generally include substantially planar pedestals (e.g. platens) and/or electrostatic chucks that support semiconductor wafers during processing. In some embodiments, semiconductor wafers are transferred to reaction chambers using robotic mechanisms and placed on lifting pins that support the wafers prior to being loaded onto pedestals and/or electrostatic chucks. Damage to the semiconductor wafers or lower yields may result from improper wafer leveling during various stages of transporting the wafers to and from the reaction chamber or positioning the wafers in the reaction chamber. In addition, the various stages of the wafer handling system are maintained at class 10 to class 1 clean room levels as the presence of even the smallest contamination particles may result in significantly lower yields.

Improved systems and methods of controlling semiconductor wafer fabrication processes are provided. The systems and processes described herein are not limited to any specific semiconductor process technology, production area, equipment, technology node, fabrication tool, wafer size, etc. The processes described herein may be performed by apparatus including among its components any suitable commercially available equipment commonly used in the art to fabricate semiconductor wafers, or alternatively, using future developed equipment. The inventors have developed systems and methods of determining semiconductor wafer leveling at various stages of wafer transfer and processing to improve process quality, transfer stability and yields and reduce costs associated with misaligned wafers.

The inventors have observed that by determining the level of a semiconductor wafer at various stages of wafer transfer and processing, detection of wafer misalignment can be achieved to avoid damaging wafers during transfer and loading and/or processing misaligned wafers resulting in lower yields. Many factors may cause semiconductor wafer leveling problems during wafer transfer and processing. For example, damaged, bound or misaligned lift pins of a lift pin assembly, damaged or misaligned guard rings, improper loading of the wafer into a reaction chamber, transfer module, cassette module, loadlock or other semiconductor wafer processing module, residual charge in an electrostatic chuck, electrostatic chuck discharge failure, contamination in reaction chambers, transfer modules, cassette modules or loadlocks, vibration, may result in wafer misalignment. The inventors have developed a system and a method of determining the wafer level in situ at various points throughout the wafer handling, transfer and processing stages of the wafer fabrication process and automatically alerting the system and/or operators of the system of wafer misalignment.

FIG. 1 is a flow chart illustrating a method 100 of controlling a semiconductor wafer fabrication process. At block 110, a semiconductor wafer is positioned in a wafer processing module. By way of example, a wafer processing module may include, but is not limited to, a loadlock, a loading station, an airlock, a reaction chamber, a cassette module or a transfer module. A reaction chamber may be a chamber in which a semiconductor wafer undergoes a process such as a chemical vapor deposition (CVD), high density plasma CVD (HDP-CVD), plasma-enhanced CVD (PECVD), physical vapor deposition (PVD), atomic layer deposition (ALD), ion-enhanced ALD (iALD), resist strip, chemical etch, plasma etch, sputtering, lithography or other semiconductor process.

In some embodiments, the wafer processing module may include a wafer support assembly, including, but not limited to, a substantially planar pedestal (e.g. a platen) or other support platform (e.g. carousel spatula) that provides a support surface for a semiconductor wafer. In some embodiments, for example, in a reaction chamber, the wafer may be retained to the pedestal using a chuck such as, for example, an electrostatic chuck (ESC). In various embodiments, the pedestal may include an embedded electrode for wafer retention during processing. The embedded electrode may be charge conductive and provide electrostatic retention forces to the wafer with the application of a voltage from a power supply. In various embodiments, the wafer may be positioned along a first surface of an electrostatic chuck in the module at block 110. In some embodiments, two or more electrodes of the electrostatic chuck may be energized to electrostatically hold the wafer to the first surface of the electrostatic chuck. In some embodiments, a lift pin assembly including one or more lift pins may be used to position the wafer above a first surface of the pedestal and to lower the pedestal onto the first surface of the pedestal. The lift pin assembly may be operated using a wide range of driving operators including, but not limited to, pneumatic driving operators, hydraulic driving operators, or electromechanical driving operators. In some embodiments, at block 110, the wafer may be positioned above a first surface in the wafer processing module. For example, the wafer may be positioned on one or more lift pins above a first surface of a pedestal in a wafer processing module. In other embodiments, the wafer may be lowered to the first surface using a lift pin assembly.

In various embodiments, a semiconductor wafer may be transferred between various wafer processing modules including a loadlock, a loading station, an airlock, a reaction chamber, a cassette module or a transfer module using any appropriate suitable commercially available equipment commonly used in the art to transfer semiconductor wafers such as, for example, robotic mechanisms, cantilevered transfer mechanisms, vacuum transfer mechanisms, or alternatively, using future developed equipment. In some embodiments, a wafer processing module may include an opening, such as a slot valve or entry door, in one or more sidewalls to permit transferring wafers into and out of the wafer processing module. In some embodiments, the wafer processing module may include a viewing assembly to permit visual inspection of the wafer in the module. For example, the wafer processing module may include a window or dome of a substantially transparent or translucent material such as, for example, quartz to permit visual inspection of the wafer in the module. In other embodiments, the wafer processing module may include an imaging sensor in the chamber to permit visual inspection.

At block 120, a signal is transmitted from a signal emitter positioned at a predetermined transmission angle relative to a vertical axis of the wafer processing module at an intended reflectance point, or an axis normal (i.e. perpendicular) to the wafer support assembly in the wafer processing module, so that the signal is reflected from the wafer and to check leveling of the wafer. In some embodiments, the signal emitter is positioned on an interior sidewall of the wafer processing module. In various embodiments, the signal emitter is vacuum resistant and includes a vacuum resistant sensor. In other embodiments, the signal emitter is positioned on an exterior sidewall of the wafer processing module that permits the signal to penetrate the sidewall and reflect from the wafer. For example, a signal emitter externally positioned relative to the wafer processing module may be utilized in an end-point determination system permitting signals to pass through one or more walls of the module. In some embodiments, the signal emitter is positioned along a first side of the wafer processing module to transmit the signal at the predetermined transmission angle relative to the vertical axis of the wafer processing module.

The signal emitter may include any suitable commercially available signal emitter commonly used in the art to transmit signals and sense reflective signals or alternatively, using future developed signal emitters. By way of example, the signal emitter may be a spot type or area type signal emitter with a fiber sensor manufactured by Omron having a sensor resolution of approximately 0.05 to 1 mm (e.g. 0.045 to 1.05 mm) resolution. In some embodiments, the signal emitter may be positioned at a predetermined transmission angle relative to an axis normal to an electrostatic chuck that electrostatically holds the wafer. In various embodiments, the signal emitter may be positioned at a predetermined transmission angle relative to an axis normal to a lowered first surface of a wafer support assembly (e.g. wafer lowered using a lift pin assembly) such that the signal is reflected from the lowered wafer and to check leveling of the lowered wafer. In other embodiments, the signal emitter may be positioned at a predetermined transmission angle relative to an axis normal to a raised first surface of a wafer support assembly (e.g. wafer raised using a lift pin assembly) such that the signal is reflected from the raised wafer and to check leveling of the raised wafer.

At block 130, a signal receiver positioned at a predetermined reflectance angle relative to a vertical axis of the wafer processing module at the intended reflectance point, or an axis normal to the wafer support assembly in the wafer processing module, monitors for the reflected signal. The predetermined positioning of the signal emitter and the signal receiver are based on a light reflectance algorithm such that the angle of transmission ($\theta_T$) relative to an axis normal to the wafer support assembly and the signal emitted from the signal emitter equals the angle of reflectance ($\theta_R$) relative to the axis normal to the wafer support assembly and the signal received at the signal receiver ($\theta_T=\theta_R$). The predetermined angle of transmission assumes a properly aligned wafer positioned in the wafer processing module. The predetermined positioning of the signal emitter and the signal receiver may be determined based on any selected reflectance position along a wafer surface. For example, the reflectance position may be the center of the wafer along the top surface of the wafer. In some embodiments, the reflectance position may be a selected distance (e.g. 10 mm, 50 mm, etc.) relative to the center or an edge of the wafer along the top surface. The inventors have observed that the use of this algorithm in the systems and methods described herein provides an improved mechanism for determining wafer leveling in a wafer processing module at various stages of wafer transfer, handling and processing such that wafer misalignment may be detected to avoid damaging wafers during transfer and loading and/or processing misaligned wafers resulting in lower yields.

In various embodiments, the signal receiver may be positioned to monitor for the reflected signal at a predetermined reflectance angle relative to an electrostatically held wafer. The predetermined reflectance angle assumes a properly aligned wafer positioned in the wafer processing. In some embodiments, the signal receiver may be positioned to monitor for the reflected signal at a predetermined reflectance angle relative to an axis normal to a lowered first surface of a wafer support assembly (e.g. wafer lowered using a lift pin assembly) such that the signal is reflected and expected to be received from the lowered wafer and to check leveling of the lowered wafer. In other embodiments, the signal receiver may be positioned to monitor for the reflected signal at a predetermined reflectance angle relative to an axis normal to a raised first surface of a wafer support assembly (e.g. wafer raised using a lift pin assembly) such that the signal is reflected and expected to be received from the raised wafer and to check leveling of the raised wafer.

For example, for a 300 mm wafer positioned in an ESC in a reaction chamber designed for an etching process and having an interior diameter of 600 mm, a signal emitter may be positioned to emit a signal at a predetermined transmission angle of 80 degrees relative to the normal of the ESC at the center of the top surface of the wafer along an interior side wall of the reaction chamber (approximately 52.90 mm above the top surface of the wafer) and assuming that the wafer is properly aligned. The signal receiver would be positioned to receive a reflected signal at a predetermined reflectance angle of 80 degrees relative to the normal of the ESC at the center of the top surface of the wafer along an opposite interior side wall of the reaction chamber (approximately 52.90 mm above the top surface of the wafer) and assuming that the wafer is properly aligned. Additionally by way of example, if an intended reflectance point 50 mm from the center of the top surface of the wafer relative to the ESC, and toward the interior sidewall of the reaction chamber where the signal receiver is to be positioned, is selected, the signal emitter may be positioned to emit a signal at a predetermined incident angle of 80 degrees relative to the normal of the ESC at the selected intended reflectance point (approximately 61.71 mm above the top surface of the wafer) and assuming that the wafer is properly aligned. The signal receiver is then positioned to receive the reflected signal at a predetermined reflectance angle of 80 degrees relative to the normal of the ESC at the selected intended reflectance point (approximately 44.08 mm above the top surface of the wafer) and assuming that the wafer is properly aligned.

Referring back to block 130, the signal receiver monitors for the reflected signal from its predetermined position along the wafer processing module. In the illustrated embodiment, at block 140, if the reflected signal is received at the signal receiver, then the wafer level is determined to be substantially aligned and the succeeding handling, transfer or process may proceed as illustrated in block 142. However, if the reflected signal is not received at the signal receiver, then the wafer level is determined to be substantially misaligned and a warning indication is generated as shown in block 144. For example, termination of the scheduled transfer, handling or process operation may occur and/or a visual or audible message, signal or alarm indicating wafer misalignment may be issued so that it is received by the semiconductor wafer fabrication system and/or operators of the system. In various embodiments, a visual inspection of the wafer in the module is performed based on a received warning indication. Thus, corrective action may be taken to correct the wafer misalignment and avoid damaging wafers during transfer and loading and/or processing misaligned wafers resulting in lower yields.

Figure 2:
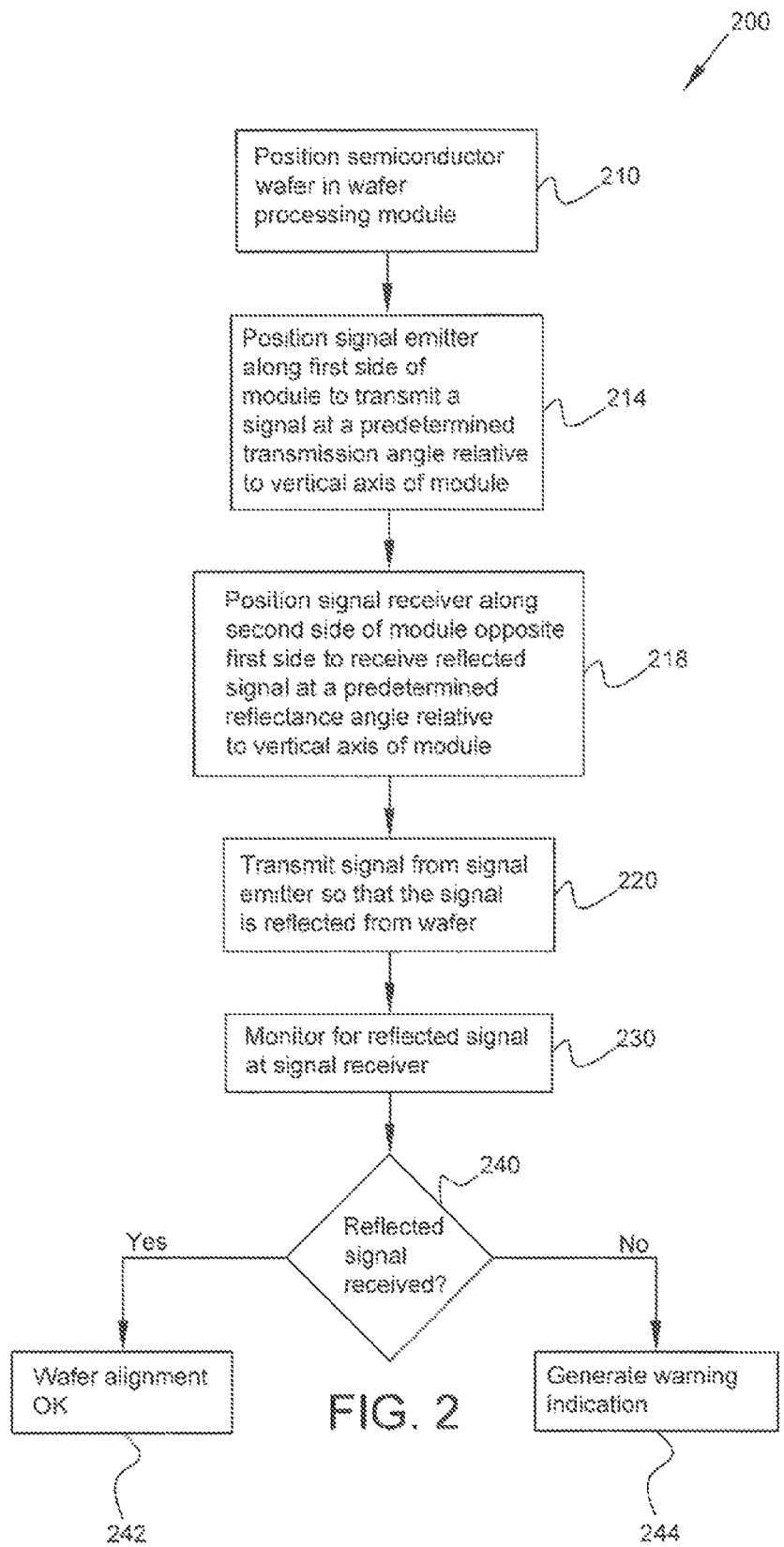
FIG. 2 is a flow chart illustrating a method of controlling a semiconductor wafer fabrication process according to some embodiments.

FIG. 2 shows a flow chart of a method of controlling a semiconductor wafer fabrication process according to some embodiments. At block 210, a semiconductor wafer is positioned in a wafer processing module as described above for FIG. 1. At block 214, a signal emitter is positioned along a first side of the wafer processing module to transmit a signal at a predetermined transmission angle relative to a vertical axis of the wafer processing module at the intended reflectance point, or an axis normal to the wafer support assembly in the wafer processing module. In some embodiments, the first side of the wafer processing module is an interior sidewall. In various embodiments, the signal emitter is an environment resistant emitter having a low pressure light sensor. In other embodiments, the first side of the wafer processing module is an exterior sidewall. In various embodiments, an exterior sidewall is selected to minimize environmental stressors on the emitter and associated sensor. The module permits signal (e.g. light) passage through the sidewall at the predetermined location of the signal emitter to check leveling of the wafer in the module and so that the signal is reflected from the wafer. At block 216, a signal receiver is positioned along a second side of the module opposite the first side to receive the reflected signal at a predetermined reflectance angle relative to the vertical axis of the wafer processing module at the intended reflectance point, or the axis normal to the wafer support assembly in the wafer processing module. The predetermined positioning of the signal emitter and the signal receiver are based on a light reflectance algorithm as described above for FIG. 1. In various embodiments, the intended reflectance point along a surface of the wafer is selected such that leveling at various points along the wafer may be determined.

At block 220, a signal is transmitted from the signal emitter so that the signal is reflected from the wafer as described above for FIG. 1. At block 230, monitoring for the selected signal is performed at the signal received as described above for FIG. 1. At block 240, a determination is made as to whether the reflected signal is received. If the reflected signal is received at the signal receiver, then the wafer level is determined to be substantially aligned and the succeeding handling, transfer or process may proceed as illustrated in block 242. However, if the reflected signal is not received at the signal receiver, then the wafer level is determined to be substantially misaligned and a warning indication is generated as shown in block 244 and described above for FIG. 1.

Figure 3:
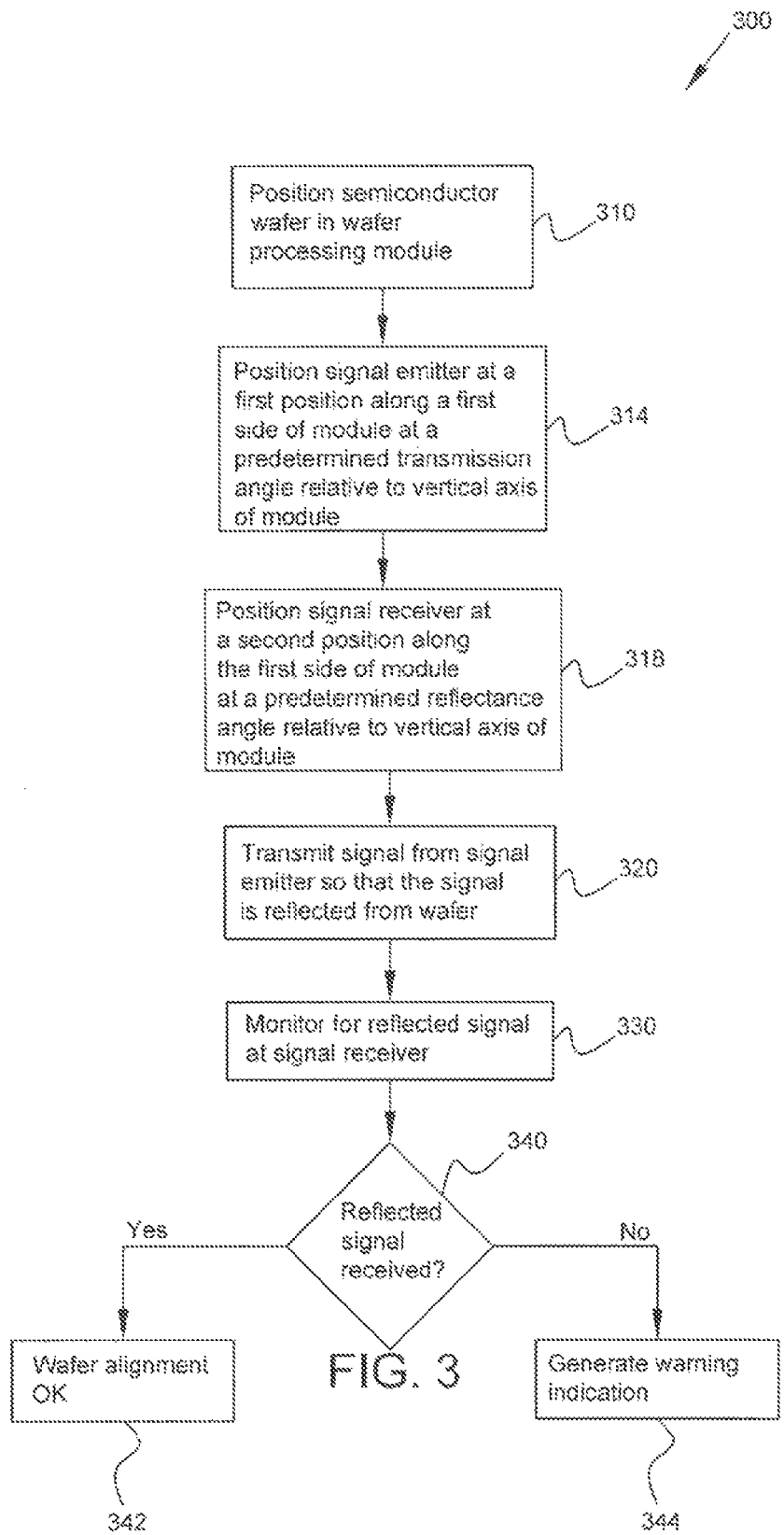
FIG. 3 is a flow chart illustrating a method of controlling a semiconductor wafer fabrication process according to embodiments of the present disclosure.

With reference now to FIG. 3, a flow chart of a method of controlling a semiconductor wafer fabrication process according to some embodiments is shown. At block 310, a semiconductor wafer is positioned in a wafer processing module as described above for FIGS. 1 and 2. At block 314, a signal emitter is positioned at a first position along a first side of the wafer processing module to transmit a signal at a predetermined transmission angle relative to a vertical axis of the wafer processing module at the intended reflectance point, or an axis normal to the wafer support assembly in the wafer processing module, to check leveling of the wafer in the module and such that the signal is reflected from the wafer. In various embodiments, the first side of the wafer processing module is a side opposite the wafer position. In some embodiments, the first side of the wafer processing module is an interior wall. In various embodiments, the signal emitter is an environment resistant emitter having a low pressure light sensor. In other embodiments, the first side of the wafer processing module is an exterior wall. At block 316, a signal receiver is positioned at a second position along the first side of the module to receive the reflected signal at a predetermined reflectance angle relative to the vertical axis of the wafer processing module at the intended reflectance point, or the axis normal to the wafer support assembly in the wafer processing module. The predetermined positioning of the signal emitter and the signal receiver are based on a light reflectance algorithm as described above for FIG. 1. In various embodiments, the intended reflectance point along a surface of the wafer is selected such that leveling at various points along the wafer may be determined. Blocks 320 to 340 illustrate steps of a method of controlling a semiconductor wafer fabrication process that are substantially similar to that described above for blocks 220 to 240.

Figure 4:
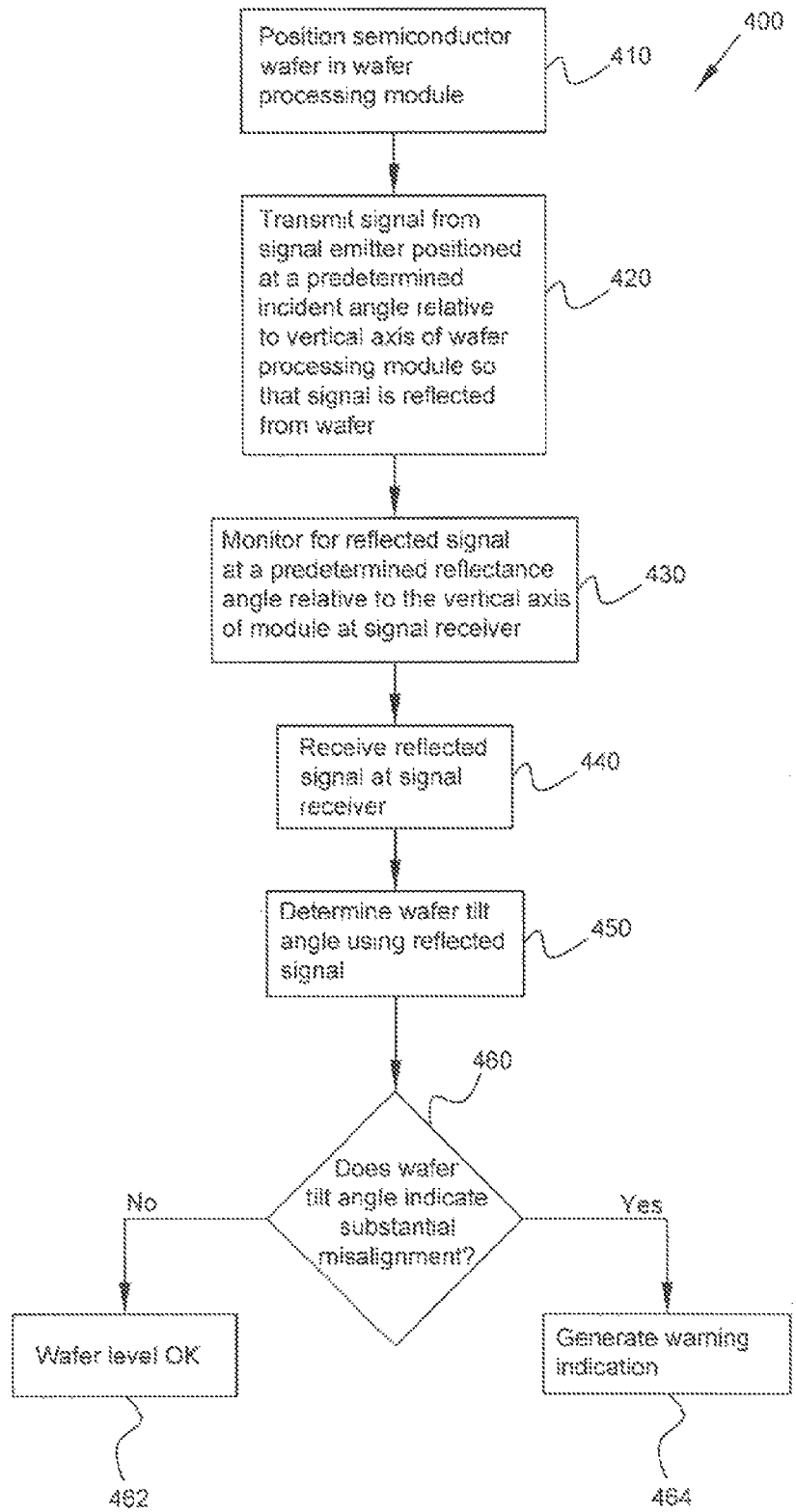
FIG. 4 is a flow chart illustrating a method of controlling a semiconductor wafer fabrication process according to embodiments of the present disclosure.

FIG. 4 shows a flow chart of a method of controlling a semiconductor wafer fabrication process according to some embodiments. Blocks 410 to 430 illustrate steps of a method of controlling a semiconductor wafer fabrication process that are substantially similar to that described above for blocks 110 to 130. In the illustrated embodiment, the reflected signal is received at the signal receiver as block 440. For example, in the above described example for a 300 mm wafer positioned in a reaction chamber having an interior diameter of 500 mm, the signal emitter and signal receiver are positioned to respectively emit and receive a signal at a respective predetermined transmission angle of 80 degrees, and predetermined reflectance angle of 80 degrees, relative to the normal of the ESC at the center of the top surface of the wafer along opposing interior side walls of the reaction chamber (approximately 52.90 mm above the top surface of the wafer.) At block 440, the emitted signal is received at the signal receiver.

At block 450, a wafer tilt angle ($\theta_{TW}$) is determined using the reflected signal. For example, the signal receiver may determine that the actual reflectance angle ($\theta_{AR}$) is 79.6 degrees. However, as described above, the expected reflectance angle ($\theta_R$) is 80 degrees. The signal receiver may compare the actual reflectance angle ($\theta_{AR}$) with a predetermined reflectance angle ($\theta_R$) to determine the wafer tilt angle ($\theta_{TW}$). The inventors have determined that the wafer tilt angle ($\theta_{TW}$) may be determined as $\theta_T +/- \theta_{AR}$, or one half of the compared difference between the expected reflectance angle ($\theta_R$) and the actual reflectance angle ($\theta_{AR}$), or one half of the difference between $\theta_{AR}$ and ($90 - \theta_R$). In the present example, the signal receiver may determine that the wafer tilt angle ($\theta_{TW}$) is approximately 0.4 degrees. In some embodiments, the signal receiver may determine the distance from the top surface of the wafer at which the signal is received. In the present example, the signal receiver may determine that the distance from the top surface of the wafer at which the signal is received is approximately 54.99 mm. In various embodiments, the wafer tilt angle may be expressed and/or determined as a function of this determined distance.

At block 460, a determination as to whether the wafer tilt angle ($\theta_{TW}$) indicates substantial misalignment of the wafer. In various embodiments, the determined actual wafer tilt angle ($\theta_{TW}$) may be compared to selected and/or stored parameters for the wafer tilt angle. In some embodiments, the determined wafer tilt angle ($\theta_{TW}$) may be compared to a predetermined wafer tilt angle associated with proper wafer alignment. In various embodiments, the determined actual reflectance angle ($\theta_{AR}$) is compared with a predetermined reflectance angle ($\theta_R$). In some embodiments, the parameters for the wafer tilt angle ($\theta_{TW}$) may vary based on the particular wafer, wafer processing module, or other suitable integrated circuit design considerations For example, a wafer tilt angle ($\theta_{TW}$) indicating substantial wafer misalignment may be smaller for a reaction chamber than a load lock module. At block 462, the determined wafer tilt angle ($\theta_{TW}$) indicates that the wafer leveling is acceptable and within parameters and scheduled handling, transfer or processing of the wafer may proceed. However, if the determined wafer tilt angle ($\theta_{TW}$) indicates substantial wafer misalignment, then a warning indication is generated as shown in block 464 and described above for FIG. 1. In some embodiments, a warning indication is generated if the comparison between an actual determined reflectance angle ($\theta_{AR}$) and a predetermined reflectance angle ($\theta_R$) indicates a difference of at least 0.2 degrees. In other embodiments, a warning indication is generated if the comparison between the actual reflectance angle ($\theta_{AR}$) and a predetermined reflectance angle ($\theta_{AR}$) indicates a difference of at least 0.6 degrees.

In some embodiments, steps of the method can be implemented by a general purpose computer programmed in accordance with the principals discussed herein. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

Figure 5:
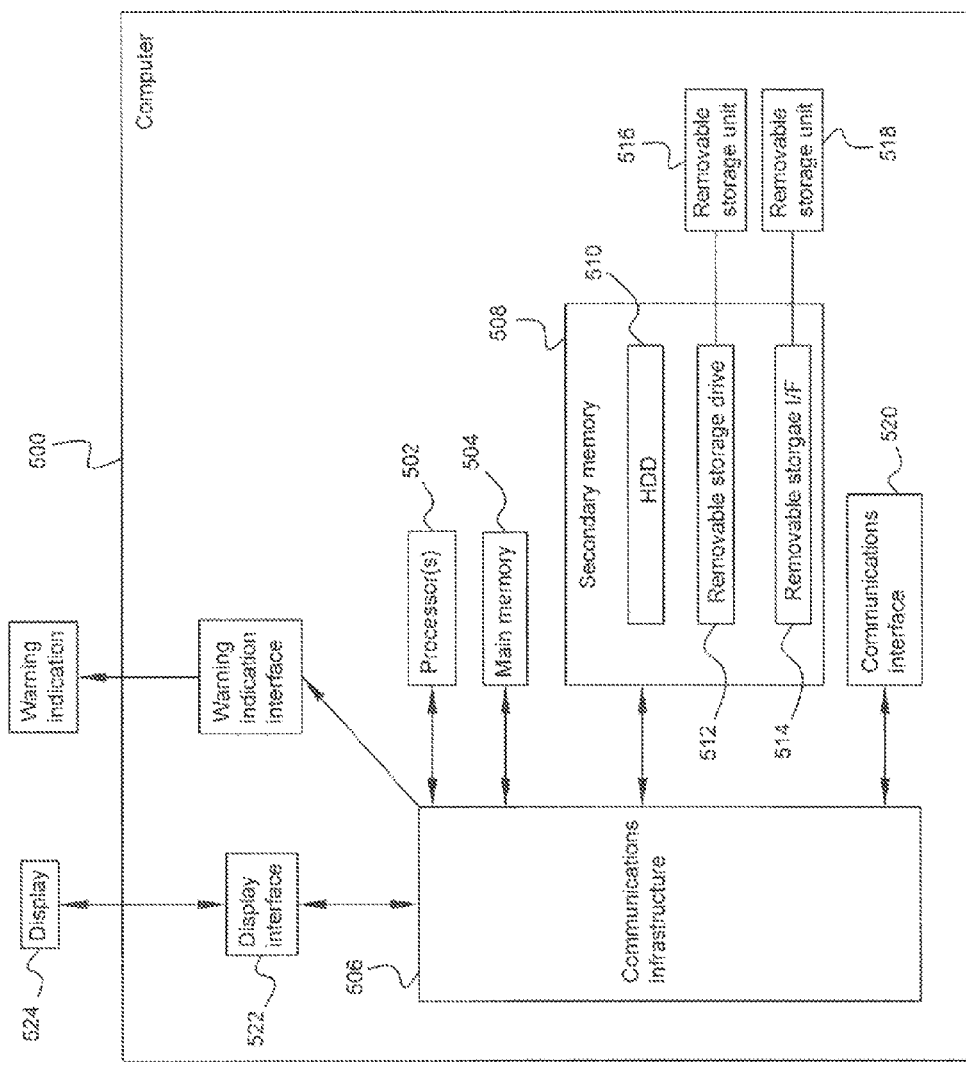
FIG. 5 is a diagram of an illustrative example of an architecture of a computer processing unit according to some embodiments.

A diagram of an illustrative example of an architecture of a computer processing unit according to some embodiments is shown in FIG. 5. Embodiments of the subject matter and the functional operations for various steps of processes described in this specification can be implemented in electronic circuitry, or in computer firmware, or hardware, including the structures disclosed in this specification and their equivalents, or in combinations of one or more of them. Embodiments of the subject matter described in this specification can be implemented as one or more computer program products, i.e., one or more modules of computer program instructions encoded on a tangible machine readable storage medium for execution by, or to control the operation of, data processing apparatus. The tangible storage medium can be a computer readable medium. The computer readable medium can be a machine-readable storage device, a machine-readable storage substrate, a memory device, a hard disk drive, a tape drive, an optical drive (such as, but not limited to CDROM, DVD, or BDROM) or the like, or a combination of one or more of them.

At least a portion of the system for controlling a wafer fabrication process described herein may be implemented in computer processing unit 500 and specifically in software and where results (e.g. wafer tilt angle, incident angle, reflectance angle), system parameters and/or warning indications may be presented to system operator on a graphical user interface (GUI) on a display device such as a computer monitor 524 (526) or other display device. Embodiments of the subject matter described in this specification can be implemented on a computer 500 having a keyboard, pointing device, e.g., a mouse or a trackball, by which the operator can provide input to the computer. Other kinds of devices can be used to provide for interaction with an operator as well; for example, input from the operator can be received in any form, including acoustic, speech, or tactile input. In various embodiments, the computer system 500 includes functionality providing for various components of the systems for controlling wafer fabrication processes and steps of the corresponding methods as described, for example, in FIGS. 1-7.

As illustrated in FIG. 5, computer processing unit 500 may include one or more processors 502. The processor 502 is connected to a communication infrastructure 506 (e.g., a communications bus, cross-over bar, or network). Computer processing unit 500 may include a display interface 522 that forwards graphics, text, and other data from the communication infrastructure 506 (or from a frame buffer not shown) for display on the display unit 524. Computer processing unit 500 may include a warning indication interface 528 that forwards warning indicators and other data from the communication infrastructure 506 (or from a frame buffer not shown) to a warning indicator 526.

Computer processing unit 500 may also include a main memory 504, such as a random access memory (RAM), and a secondary memory 508. The secondary memory 508 may include, for example, a hard disk drive (HDD) 510 and/or removable storage drive 512, which may represent a floppy disk drive, a magnetic tape drive, an optical disk drive, or the like. The removable storage drive 512 reads from and/or writes to a removable storage unit 516. Removable storage unit 516 may be a floppy disk, magnetic tape, optical disk, or the like. As will be understood, the removable storage unit 516 may include a computer readable storage medium having stored therein computer software and/or data. Computer readable storage media suitable for storing computer program instructions and data include all forms data memory including nonvolatile memory, media and memory devices, including by way of example semiconductor memory devices, e.g., EPROM, EEPROM, and flash memory devices; magnetic disks, e.g., internal hard disks or removable disks; magneto optical disks; and CD ROM, DVD-ROM, and BDROM disks. The processor 502 and the memory 504 can be supplemented by, or incorporated in, special purpose logic circuitry.

In alternative embodiments, secondary memory 508 may include other similar devices for allowing computer programs or other instructions to be loaded into computer processing unit 500. Secondary memory 508 may include a removable storage unit 518 and a corresponding interface 514. Examples of such removable storage units include, but are not limited to, USB or flash drives, which allow software and data to be transferred from the removable storage unit 518 to computer processing unit 500.

Computer processing unit 500 may also include a communications interface 520. Communications interface 520 allows software and data to be transferred between computer processing unit 500 and external devices. Examples of communications interface 520 may include a modem, Ethernet card, wireless network card, a Personal Computer Memory Card International Association (PCMCIA) slot and card, or the like. Software and data transferred via communications interface 520 may be in the form of signals, which may be electronic, electromagnetic, optical, or the like that are capable of being received by communications interface 520. These signals may be provided to communications interface 520 via a communications path (e.g., channel), which may be implemented using wire, cable, fiber optics, a telephone line, a cellular link, a radio frequency (RF) link and other communication channels.

The computer program products provide software to computer processing unit 500. Computer programs (also referred to as computer control logic) are stored in main memory 504 and/or secondary memory 508. Computer programs may also be received via communications interface 520. Such computer programs, when executed by a processor, enable the computer system 500 to perform features of the method discussed herein. For example, main memory 504, secondary memory 508, or removable storage units 516 or 518 may be encoded with computer program code for performing various steps of the processes described in FIGS. 1-4.

In an embodiment implemented using software, the software may be stored in a computer program product and loaded into computer processing unit 500 using removable storage drive 512, hard drive 510, or communications interface 520. The software, when executed by a processor 502, causes the processor 502 to perform the functions of various steps of the methods described herein. In another embodiment, various steps of the methods may be implemented primarily in hardware using, for example, hardware components such as a digital signal processor comprising application specific integrated circuits (ASICs). In yet another embodiment, the method is implemented using a combination of both hardware and software.

Various embodiments can be implemented in a computing system that includes a back end component, e.g., as a data server, or that includes a middleware component, e.g., an application server, or that includes a front end component, e.g., a computer having a GUI or a Web browser through which an operator can interact with an implementation of the subject matter described is this specification, or any combination of one or more such back end, middleware, or front end components. The components of the system can be interconnected by any form or medium of digital data communication, e.g., a communication network. Examples of communication networks include a local area network ("LAN") and a wide area network ("WAN"), e.g., the Internet.

FIGS. 6A-6G are simplified cross-sectional diagrams of illustrative examples of at least a portion of a system of controlling a semiconductor wafer fabrication process according to various embodiments of the present disclosure. FIG. 6A-6G illustrate simplified cross-sectional diagrams of examples of a portion of a system 600 of controlling a semiconductor wafer fabrication process according to various embodiments. In the illustrated embodiments, a semiconductor wafer processing module 610 is provided. As described above, wafer processing module 610 may include, but is not limited to, a loadlock, a loading station, an airlock, a reaction chamber, a cassette module or a transfer module. As shown, system 600 may also include a wafer support assembly 620 to support a semiconductor wafer 630 in the wafer processing module 610. Wafer support module 620 may include a substantially planar pedestal (e.g. a platen) or other support platform (e.g. carousel spatula) that provides a support surface 640 for semiconductor wafer 630. In some embodiments, for example, in a reaction chamber 610, the wafer 630 may be retained to the wafer support assembly 620 using a chuck such as, for example, an electrostatic chuck (ESC).

In the illustrated embodiments, guard ring 625 is included in wafer processing module 610. Guard ring 625 may be shaped and sized to accommodate wafer 630. In some embodiments, guard ring 625 may be integrally formed into the body of an ESC. In other embodiments, guard ring 625 may be a separate element from an ESC. As shown in FIGS. 6A, 6C, 6E and 6F, signal emitter 605 is positioned at a predetermined incident angle ($\theta_I$) relative to the wafer 630 when the wafer 630 is supported by the wafer support assembly 620. In some embodiments, signal emitter 605 may be positioned at a predetermined transmission angle ($\theta_T$) relative to an axis normal to a lowered first surface 640 of a wafer support assembly 620 when the wafer 630 is supported by the wafer support assembly 620 and was previously lowered to a first surface 640 of wafer support assembly 620 using, for example, a lift pin assembly (650 FIGS. 6B, 6D, 6G). In various embodiments, signal emitter 605 may be positioned at a predetermined transmission angle ($\theta_T$) relative to a correctly aligned electrostatically held wafer 630 when the wafer 630 is electrostatically held to first surface 640 when electrodes of an ESC were previously energized. As shown in FIGS. 6A, 6C, 6E and 6F, a signal receiver 635 is illustrated positioned at a predetermined reflectance angle ($\theta_R$) relative to the wafer 630 when the wafer 630 is correctly aligned and supported in the wafer support assembly 620. As described above, wafer 630 may be a wafer 630 previously lowered to first surface 640 of wafer support assembly 620 or a wafer 630 electrostatically held to first surface 640 by an ESC in various embodiments.

Figure 6A:
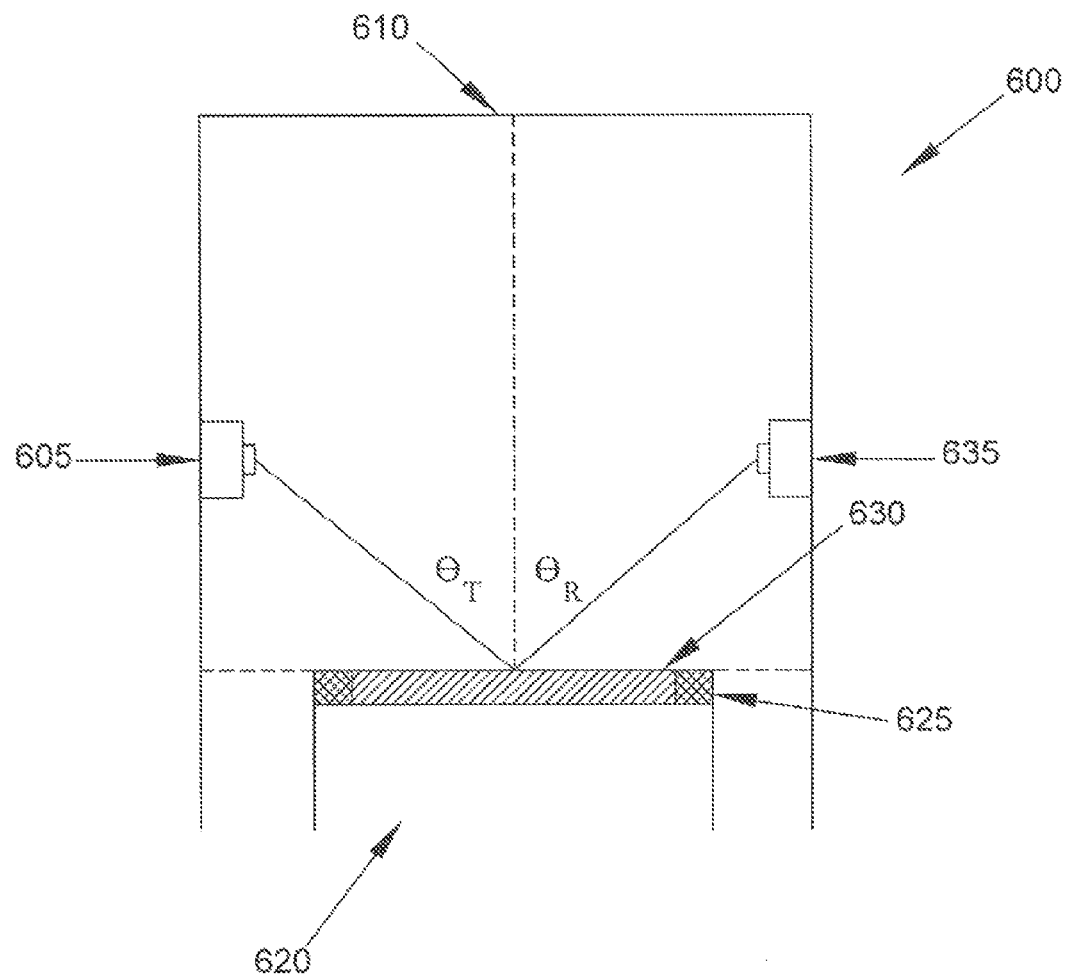
FIGS. 6A-6G are simplified cross-sectional diagrams of illustrative examples of at least a portion of a system of controlling a semiconductor wafer fabrication process according to various embodiments of the present disclosure.
Figure 6B:
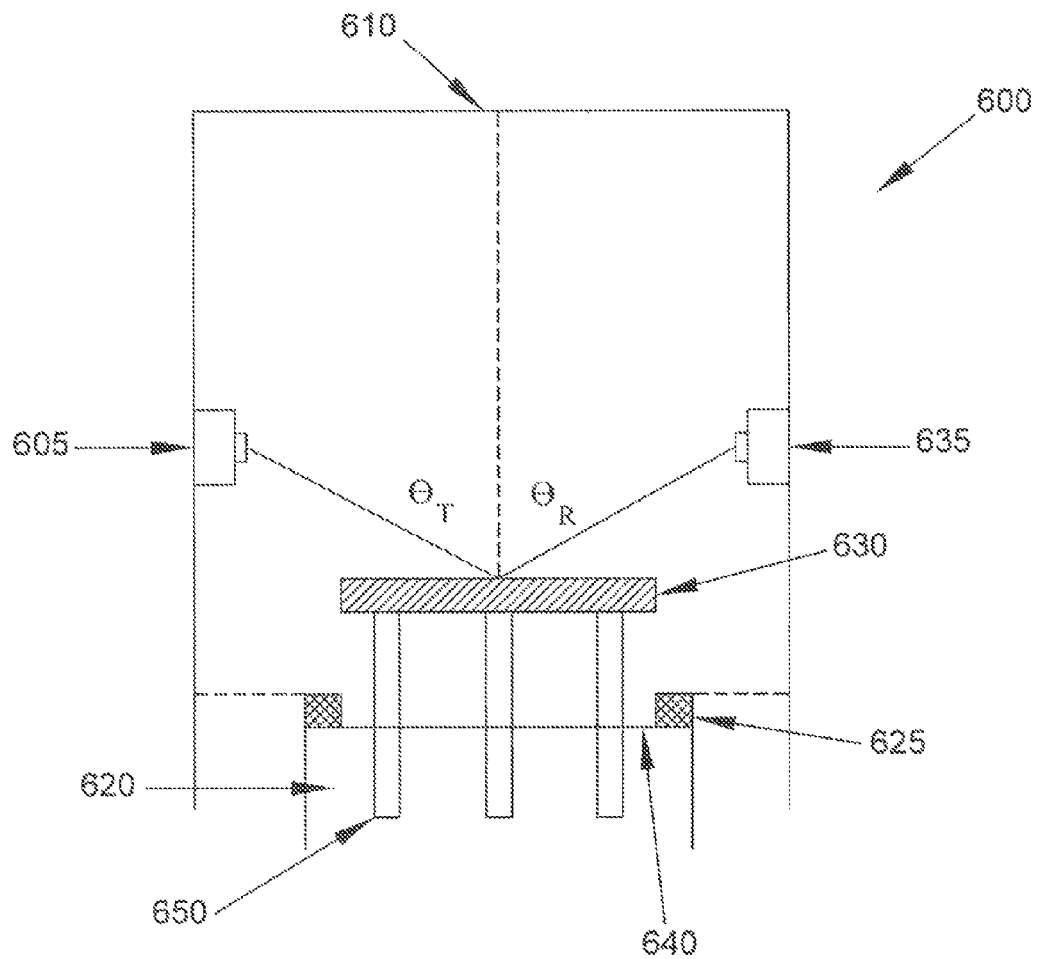
Figure 6C:
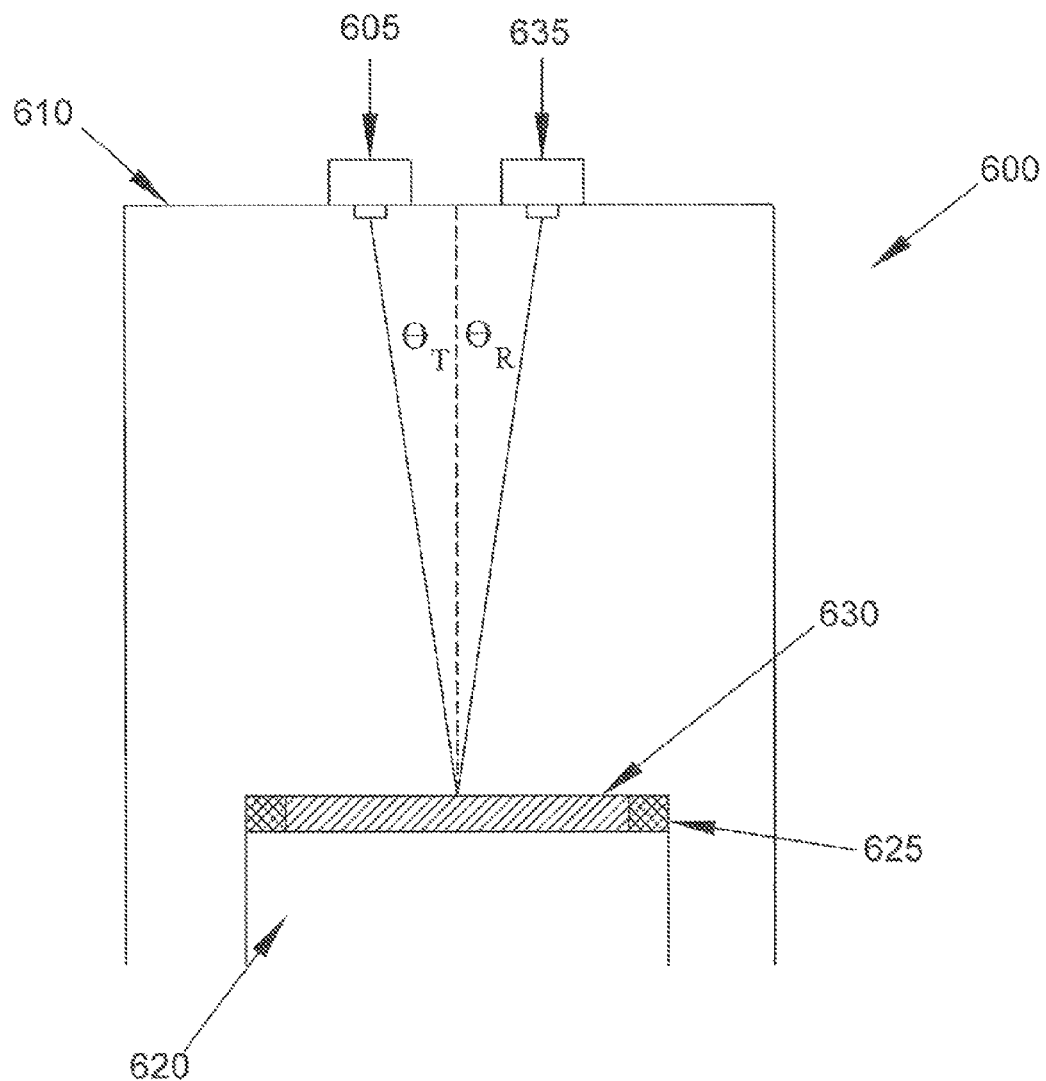
Figure 6D:
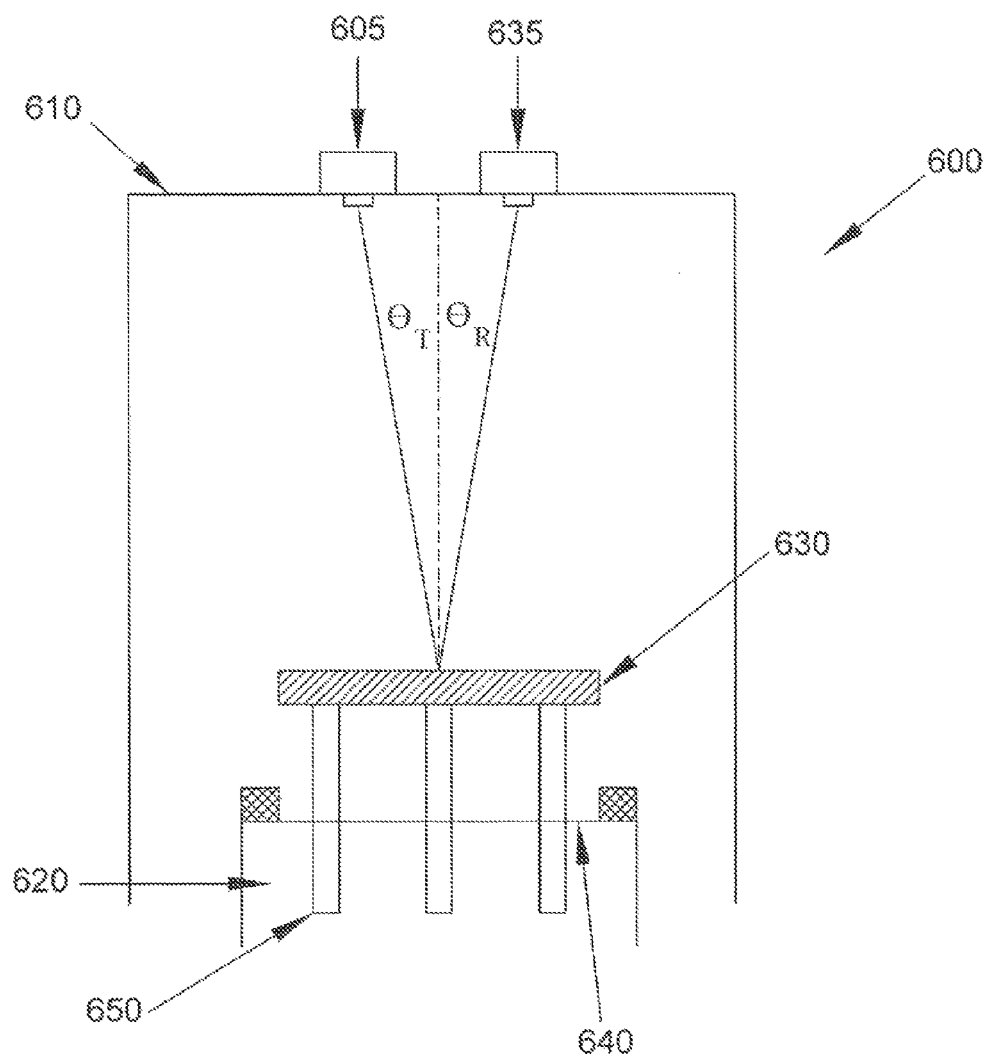
Figure 6E:
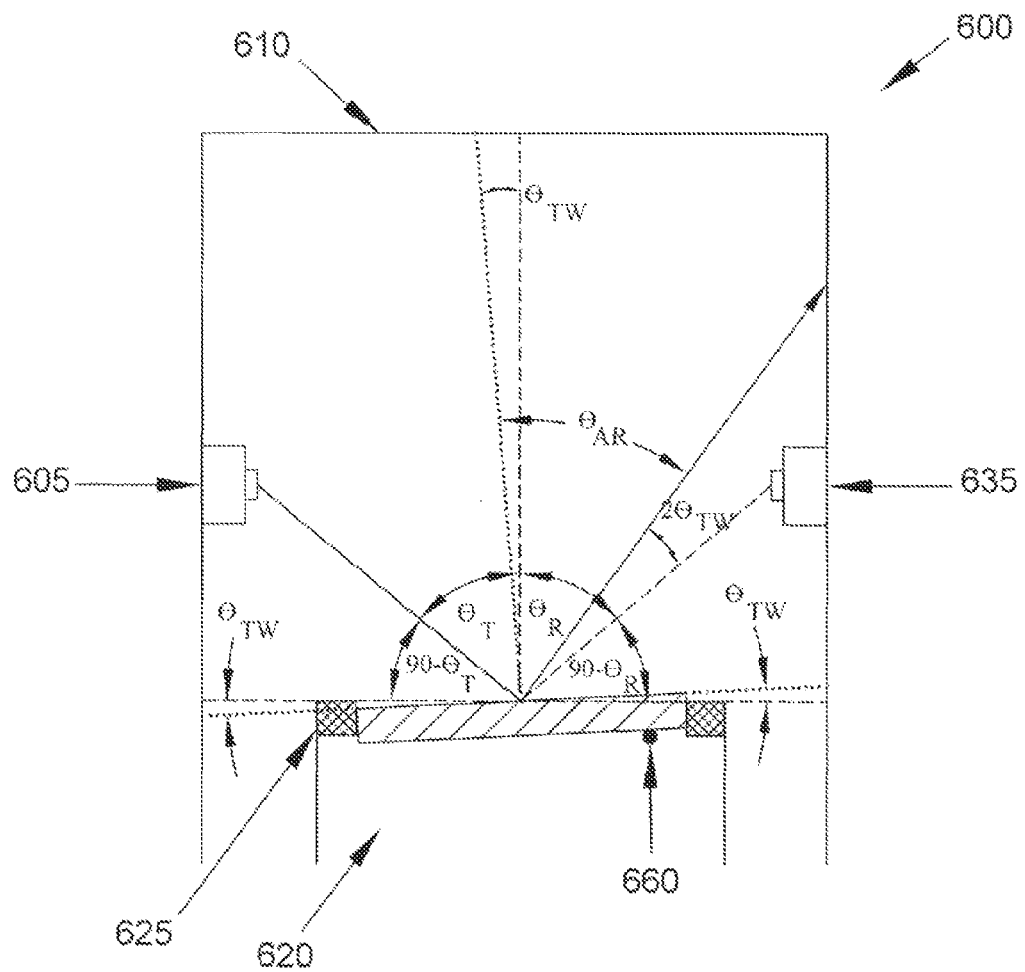
Figure 6F:
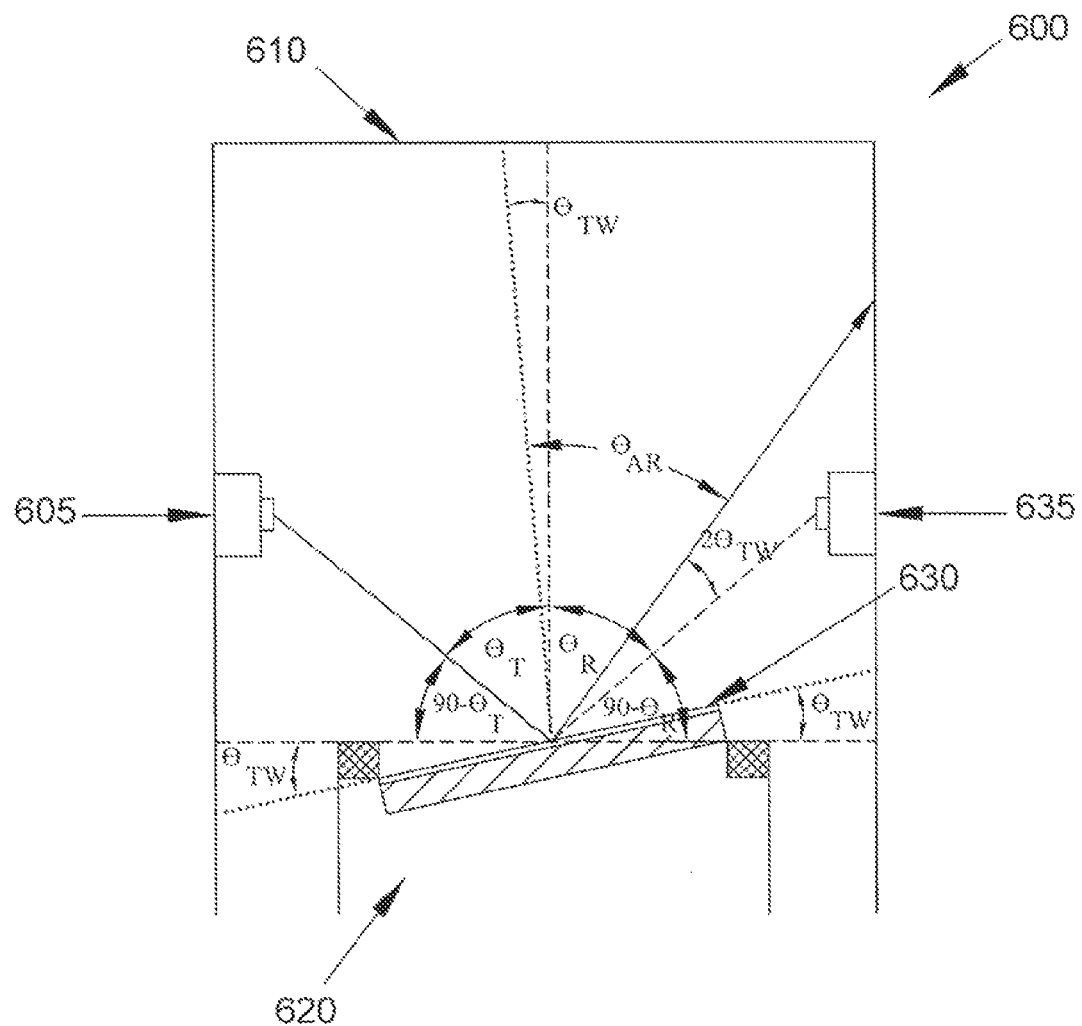
Figure 6G:
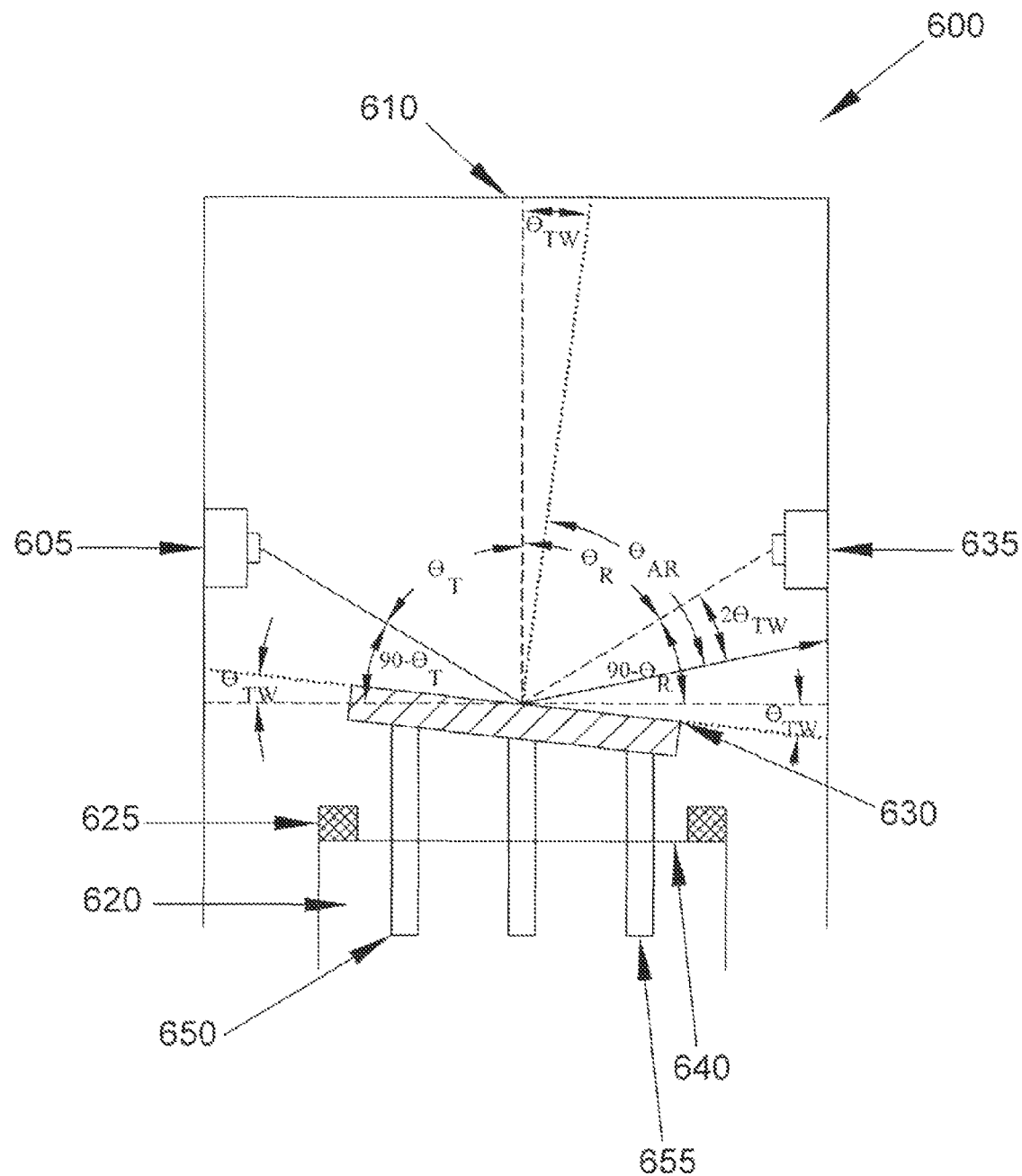

As shown in FIGS. 6B, 6D and 6G, signal emitter 605 may be positioned at a predetermined transmission angle ($\theta_T$) relative to an axis normal to a raised first surface 640 of a wafer support assembly 620 as the wafer 630 may be previously raised above a first surface 640 of wafer support assembly 620 in wafer processing module 610 using, for example, lift pin assembly 650, and where the wafer 630 is supported by the lift pin assembly 650. Signal receiver 635 may be positioned at a predetermined reflectance angle ($\theta_R$) relative to the axis normal to the raised first surface 640 of the wafer support assembly 620 where wafer 630 was previously raised using, for example, lift pin assembly 650, and where the wafer 630 is supported by the lift pin assembly 650 as shown in FIGS. 6B, 6D and 6G. FIGS. 6A-6B and 6E-6G illustrate signal emitter 605 and signal receiver 635 positioned along opposing interior sidewalls of wafer processing module 610. In various embodiments, at least two signal emitters (605) and at least two signal receivers (635) may be positioned in a wafer processing module 610 at respective predetermined transmission angles ($\theta_T$) and at respective predetermined reflectance angles ($\theta_R$) relative to the axis normal to the first surface 640 of the wafer support assembly 620 to detect wafer alignment at respective raised or lowered positions of the lift pin assembly 650. In FIG. 6C and FIG. 6D, signal emitter 605 and signal receiver 635 are shown positioned at respective first and second positions of an interior surface along an upper side of wafer processing module 610. As described above, signal emitter 605 and signal receiver 635 may be positioned along exterior sidewalls of wafer processing module 610 in some embodiments.

In various embodiments, the signal emitter and signal receiver may be integrated together (e.g. 605=635) and positioned at a position of an interior surface along an upper side of wafer processing module 610 such that $\theta_T=\theta_R=0$ degrees relative to an axis normal to a surface of the wafer support assembly. In various embodiments where the signal emitter and signal receiver are integrated together, a single sensor may be used to detect wafer alignment no matter whether the lift pin assembly 650 is in a raised or lowered position. In various embodiments, where the signal emitter 605 and signal receiver 635.

Figure 7:
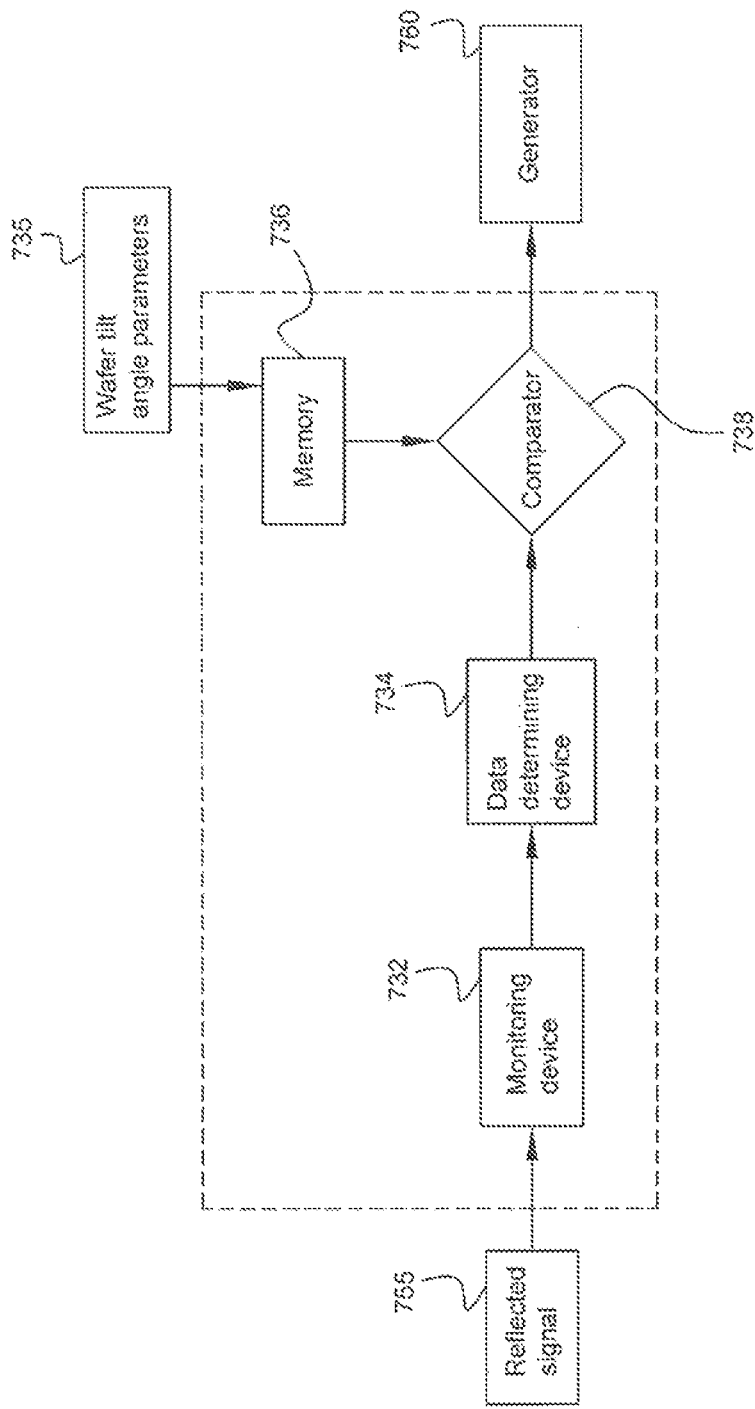
FIG. 7 is an example of at least a portion of a system of controlling a semiconductor wafer fabrication process according to embodiments of the present disclosure.

Referring now to FIG. 7, an example of a portion of a system 600 of controlling a semiconductor wafer fabrication process is shown. A monitoring device 732 is provided in signal receiver 735 to monitor for a reflected signal 755 from the wafer 630 positioned in wafer processing module 610. A data determining device 734 is shown as provided in signal receiver 735 to determine an actual reflectance angle $\theta_{AR}$ relative to an axis normal to the wafer for the reflected signal 755. In some embodiments, data determining device 734 may be provided external to signal receiver 735 such as, for example, in a processor 502 as a component of a computer processing unit 500. As shown, wafer tilt angle ($\theta_{WT}$) parameters 756 are provided to system 600 and stored, for example, in memory 736 of signal receiver 735. In some embodiments, wafer tilt angle ($\theta_{WT}$) parameters 756 may be provided to system 600 and stored in memory 736 external to signal receiver 735 such as, for example, memory 504, 508, or removal storage units 516, 518 of a computer processing unit 500. In various embodiments, wafer tilt angle ($\theta_{WT}$) parameters 756 may include predetermined reflectance angle parameters. In some embodiments, wafer tilt angle ($\theta_{WT}$) parameters 756 may include various parameters for a particular wafer 630, wafer support assembly 620, wafer processing module 610, or other suitable integrated circuit design consideration parameters. In various embodiments, wafer tilt angle ($\theta_{WT}$) parameters 756 may include parameters that indicate acceptable wafer leveling and other parameters that indicate substantial wafer misalignment.

As shown in FIG. 7, data comparator 738 is provided in signal receiver 735 to determine the difference between a determined actual reflectance angle $\theta_{AR}$ received from data determining device 734 and the predetermined reflectance angle $\theta_R$ received from memory 736. In some embodiments, data comparator 738 may be provided to determine the difference between a determined actual wafer tilt angle $\theta_{WT}$ and a wafer tilt angle $\theta_T$ stored in memory 736 for a particular wafer 630, wafer support assembly 620, and/or wafer processing module 610. In various embodiments, data comparator 738 may be provided to determine the difference between the predetermined transmission angle $\theta_T$ and the actual reflectance angle $\theta_{AR}$ received from data determining device 734. In other embodiments, data comparator 738 may be provided to determine the difference between the $\theta_{AR}$ and $(90-\theta_R)$. In some embodiments, data comparator 738 may be provided external to signal receiver 735 such as, for example, in a processor 502 as a component of a computer processing unit 500. In the illustrated embodiment, generator 760 is provided to generate a warning indication if the comparator 738 indicates the wafer 630 level is substantially misaligned. In the illustrated embodiment, generator 760 is provided external to signal receiver 735 and may include, for example, a warning indication interface 528 that forwards warning indicators and other data from the comparator 738 to a warning indicator 526.

FIGS. 6A-6D show examples of wafer 630 in a substantially aligned condition such that $\theta_T=\theta_R$ and the received actual reflectance angle $\theta_{AR}$ ($\theta_R$.) is substantially equal to the predetermined reflectance angle $\theta_R$. FIG. 6E illustrates an example of wafer 630 in a substantially misaligned condition as a portion of wafer 630 is shown resting upon a contamination particle 660 in wafer processing module 610. Signal receiver 635 monitors to receive a reflected signal 755 transmitted by signal emitter 605 and determines an actual reflectance angle of $(\theta_{AR}=\theta_T-\theta_{WT}=\theta_{AT})$ in data determining device 734 where $\theta_T$ represents a predetermined transmission angle relative to an axis normal to first surface 640 of wafer support assembly 620 supporting wafer 630, $\theta_{WT}$ represents a wafer tilt angle caused by the presence of the contamination particle 660 and $\theta_{AT}$ represents an actual transmission angle relative to the actual normal line to the wafer 630. In various embodiments, signal receiver 635 may monitor to receive a reflected signal 755 transmitted by signal emitter 605 and determine an actual reflectance angle of $(\theta_{AR}=\theta_R-\theta_{WT})$ in data determining device 734 where $\theta_R$ represents a predetermined reflectance angle relative to an axis normal to first surface 640 of wafer support assembly 620 supporting wafer 630 and $\theta_{WT}$ represents a wafer tilt angle caused by the presence of the contamination particle 660. In various embodiments, signal receiver 635 may determine an actual reflectance angle of $(\theta_{AR}=(90-\theta_R)+(2*\theta_{WT}))$ in data determining device 734 where $\theta_R$ represents a predetermined reflectance angle relative to an axis normal to first surface 640 of wafer support assembly 620 supporting wafer 630 and $\theta_{WT}$ represents a wafer tilt angle caused by the presence of the contamination particle 660. As described above, in some embodiments, determined reflectance angle $\theta_{AR}$ is compared to a predetermined reflectance angle ($\theta_R$) at data comparator 738 and a warning indication is generated at generator 760 if the comparison indicates that the wafer 630 is substantially misaligned. In other embodiments, wafer tilt angle $\theta_{WT}$ is compared to wafer tilt angle parameters stored in memory 736 at data comparator 738 and a warning indication is generated if the comparison indicates that the wafer 630 is substantially misaligned.

FIG. 6F illustrates an example of wafer 630 in a misaligned condition as a portion of wafer 630 is shown resting on a portion of guard ring 625 in wafer processing module 610. Signal emitter 635 again monitors to receive a reflected signal 755 transmitted by signal emitter 605 and determines an actual reflectance angle of $(\theta_{AR}=\theta_T-\theta_{WT}=\theta_{AT})$ in data determining device 734 where $\theta_T$ represents a predetermined transmission angle relative to an axis normal to first surface 640 of wafer support assembly 620 supporting wafer 630, $\theta_{WT}$ represents a wafer tilt angle caused by the improper loading of wafer 630 such that a portion of wafer 630 is resting on guard ring 625, and $\theta_{AT}$ represents an actual transmission angle relative to the actual normal line to the wafer 630. In various embodiments, signal receiver 635 may monitor to receive a reflected signal 755 transmitted by signal emitter 605 and determine an actual reflectance angle of $(\theta_{AR}=\theta_R-\theta_{WT})$ in data determining device 734 where $\theta_R$ represents a predetermined reflectance angle relative to an axis normal to first surface 640 of wafer support assembly 620 supporting wafer 630 and $\theta_{WT}$ represents a wafer tilt angle caused by the improper loading of wafer 630 such that a portion of wafer 630 is resting on guard ring 625. In various embodiments, signal receiver 635 may determine an actual reflectance angle of $(\theta_{AR}=(90-\theta_R)+(2*\theta_{WT}))$ in data determining device 734 where $\theta_R$ represents a predetermined reflectance angle relative to an axis normal to first surface 640 of wafer support assembly 620 supporting wafer 630 and $\theta_{WT}$ represents a wafer tilt angle caused by the improper loading of wafer 630 such that a portion of wafer 630 is resting on guard ring 625. As described above, in some embodiments, determined actual reflectance angle $\theta_{AR}$ is compared to a predetermined reflectance angle ($\theta_R$) at data comparator 738 and a warning indication is generated if the comparison indicates that the wafer 630 is substantially misaligned. In other embodiments, wafer tilt angle $\theta_{WT}$ is compared to wafer tilt angle parameters stored in memory 736 at data comparator 738 and a warning indication is generated at generator 760 if the comparison indicates that the wafer 630 is substantially misaligned.

FIG. 6G illustrates an example of wafer 630 in a misaligned condition as at least one of the lift pins of lift pin assembly 650 is shown as damaged or bound and wafer 630 is shown resting on the lift pin assembly 650. Signal emitter 635 monitors to receive a reflected signal 755 transmitted by signal emitter 605 and determines an actual reflectance angle of $(\theta_{AR}=\theta_T+\theta_{WT}=\theta_{AT})$ in data determining device 734 where $\theta_T$ represents a predetermined transmission angle relative to an axis normal to first surface 640 of wafer support assembly 620 supporting wafer 630, $\theta_{WT}$ represents a wafer tilt angle and $\theta_{AT}$ represents an actual transmission angle relative to the actual normal line to the wafer 630. In the illustrated example, $\theta_{WT}$ represents a wafer tilt angle caused by the damaged or bound lift pin. In various embodiments, signal receiver 635 may monitor to receive a reflected signal 755 transmitted by signal emitter 605 and determine an actual reflectance angle of $(\theta_{AR}=\theta_R+\theta_{WT})$ in data determining device 734 where $\theta_R$ represents a predetermined reflectance angle relative to an axis normal to first surface 640 of wafer support assembly 620 supporting wafer 630 and $\theta_{WT}$ represents a wafer tilt angle. In various embodiments, signal receiver 635 may determine an actual reflectance angle of $(\theta_{AR}=(90-\theta_R)+(2*\theta_{WT}))$ in data determining device 734. As described above, in some embodiments, determined actual reflectance angle $\theta_{AR}$ is compared to a predetermined reflectance angle ($\theta_R$) at data comparator 738 and a warning indication is generated at generator 760 if the comparison indicates that the wafer 630 is substantially misaligned. In other embodiments, wafer tilt angle $\theta_{WT}$ is compared to wafer tilt angle parameters stored in memory 736 at data comparator 738 and a warning indication is generated at generator 760 if the comparison indicates that the wafer 630 is substantially misaligned.

One embodiment provides a method of controlling a semiconductor wafer fabrication process including positioning a semiconductor wafer on a wafer support assembly in a wafer processing module. A signal is transmitted from a signal emitter positioned at a predetermined transmission angle relative to an axis normal to the wafer support assembly to check leveling of the wafer in the module, so that the signal is reflected from the wafer. The reflected signal is monitored at a predetermined reflectance angle relative to the axis normal to the wafer support assembly at a signal receiver. A warning indication is generated if the reflected signal is not received at the signal receiver.

Another embodiment provides a method of controlling a semiconductor wafer fabrication process including positioning a semiconductor wafer on a wafer support assembly in a semiconductor wafer processing module. A signal is transmitted from a signal emitter positioned at a predetermined transmission angle relative to an axis normal to the wafer support assembly to check leveling of the wafer in the module, such that the signal is reflected from the wafer. The embodiment includes monitoring for the reflected signal at a predetermined reflectance angle relative to the axis normal to the wafer support assembly at a signal receiver. The reflected signal is received at the signal receiver. A wafer tilt angle is determined using the reflected signal. A warning indication is generated if the determined wafer tilt angle indicates that the wafer level is substantially misaligned.

A further embodiment provides a system for controlling a semiconductor fabrication process. The system includes a semiconductor wafer processing module and a wafer support assembly to support the semiconductor wafer in the processing module. A signal emitter is positioned at a predetermined transmission angle relative to an axis normal to the wafer support assembly when the wafer is supported in the wafer support assembly is also included in the embodiment. The system also includes a signal receiver positioned at a predetermined reflectance angle relative to the axis normal to the wafer support assembly when the wafer is supported in the wafer support assembly. The signal receiver in the embodiment includes a monitoring device to monitor for a reflected signal from the wafer, a data determining device to determine a reflectance angle relative to the wafer for the reflected signal and a data comparator to determine the difference between the determined reflectance angle and the predetermined reflectance angle. A generator is included in the embodiment to generate a warning indication if the comparator indicates the wafer level is substantially misaligned.

While various embodiments have been described, it is to be understood that the embodiments described are illustrative only and that the scope of the subject matter is to be accorded a full range of equivalents, many variations and modifications naturally occurring to those of skill in the art from a perusal hereof.

What we claim is:

1. A method of controlling a semiconductor wafer fabrication process, comprising:
    positioning a semiconductor wafer on a planar surface of a wafer support assembly in a wafer processing module;
    determining an estimated reflectance angle measured relative to an axis normal to the planar surface of the wafer support assembly when the wafer is supported by the wafer support assembly and relative to a selected reflectance point offset from a center of the wafer by a selected distance measured parallel to an axis of the planar surface of the wafer support assembly;
    positioning a signal emitter along a first sidewall of the wafer processing module at a first distance from the planar surface of the wafer support assembly measured parallel to the axis normal to the planar surface of the wafer support assembly and at a determined transmission angle to the selected reflectance point, wherein the determined transmission angle is measured relative to the axis normal to the planar surface of the wafer support assembly when the wafer is supported by the wafer support assembly;
    positioning a signal receiver along a second sidewall of the wafer processing module opposite the first sidewall and at a second distance from the planar surface of the wafer support assembly measured parallel to the axis normal to the planar surface of the wafer support assembly, wherein the first distance is different than the second distance and wherein the respective first and second distances are determined based on the estimated reflectance angle, the determined transmission angle, and the selected reflectance point;
    transmitting a signal from the signal emitter to the selected reflectance point to check leveling of the wafer in the module;
    monitoring for the reflected signal at the signal receiver at the estimated reflectance angle; and
    generating a warning indication if the reflected signal is not received at the signal receiver.

2. The method of claim 1, further comprising:
    determining a transmission angle measured relative to the axis normal to the planar surface of the wafer support assembly to the selected reflectance point and from the signal emitter positioned at the first distance; and
    transmitting the signal at the determined transmission angle.

3. The method of claim 1, further comprising:
    receiving the reflected signal at the signal receiver;
    determining an actual reflectance angle measured relative to the axis parallel to the planar surface of the wafer support assembly when the wafer is supported by the wafer support assembly for the received signal;
    determining an actual wafer tilt angle using the determined actual reflectance angle and the estimated reflectance angle; and
    generating a warning indication if the determined actual wafer tilt angle exceeds a permitted wafer tilt angle.

4. The method of claim 3, further comprising:
    generating the warning indication if the determined actual wafer tilt angle is 0.2 degrees or more.

5. The method of claim 3, further comprising:
    generating the warning indication if the determined actual wafer tilt angle is 0.6 degrees or more.

6. The method of claim 1, further comprising:
    positioning the wafer above the planar surface of the wafer support assembly in the module;
    lowering the wafer to the planar surface using a lift pin assembly; and
    determining the estimated reflectance angle and the first and second distances based on the lowered wafer.

7. The method of claim 1, further comprising:
    positioning the wafer along a first planar surface of an electrostatic chuck in the module;
    energizing two or more electrodes of the electrostatic chuck to electrostatically hold the wafer to the first surface;
    wherein the step of transmitting the signal includes transmitting from the signal emitter positioned at the first distance to the selected reflectance point at a determined transmission angle relative to the axis normal to the first planar surface of the electrostatic chuck.

8. The method of claim 1, further comprising:
    receiving the warning indication; and
    visually inspecting the wafer in the module based on the warning indication.

9. The method of claim 3, further comprising:
    computing a first difference between 90 degrees and the estimated reflectance angle;

computing a second difference between the determined actual reflectance angle and the computed first difference;

dividing the computed second difference by two to determine the actual wafer tilt angle;

comparing the determined actual wafer tilt angle against stored wafer tilt angle parameters for the wafer support assembly; and generating a warning indication if the comparison indicates an actual wafer tilt angle that exceeds a permitted wafer tilt angle for the wafer support assembly.

10. A method of controlling a semiconductor wafer fabrication process, comprising:

positioning a semiconductor wafer on a planar surface of a wafer support assembly in a semiconductor wafer processing module;

determining an estimated reflectance angle measured relative to an axis normal to the planar surface of the wafer support assembly and a selected reflectance point on the wafer;

positioning a signal emitter along a first sidewall of the wafer processing module at a first distance from the planar surface of the wafer support assembly measured parallel to the axis normal to the planar surface of the wafer support assembly and at a determined transmission angle to the selected reflectance point, wherein the determined transmission angle is measured relative to the axis normal to the planar surface of the wafer support assembly when the wafer is supported by the wafer support assembly;

positioning a signal receiver along a second sidewall of the wafer processing module opposite the first sidewall and at a second distance from the planar surface of the wafer support assembly measured parallel to the axis normal to the planar surface of the wafer support assembly, wherein the respective first and second distances are different distances determined based on the estimated reflectance angle, the determined transmission angle and the selected reflectance point;

transmitting a signal from the signal emitter to the selected reflectance point to check leveling of the wafer in the module;

monitoring for the reflected signal at the signal receiver at the estimated reflectance angle;

receiving the reflected signal at an angle other than the estimated reflectance angle at the signal receiver;

determining an actual wafer tilt angle using the reflected signal angle and the determined transmission angle; and generating a warning indication if the determined actual wafer tilt angle exceeds a permitted wafer tilt angle.

11. The method of claim 10, further comprising:
generating a warning indication if the determined actual wafer tilt angle is at least 0.2 degrees or more.

12. The method of claim 10, further comprising:
generating a warning indication if the determined actual wafer tilt angle is at least 0.6 degrees or more.

13. The method of claim 10, wherein the actual wafer tilt angle is determined by:
computing a sum or difference between the determined transmission angle and the reflected signal angle.

14. A system for controlling a semiconductor wafer fabrication process, comprising:

a semiconductor wafer processing module;

a wafer support assembly to support the semiconductor wafer along a planar surface of the wafer support assembly in the processing module;

a signal emitter positioned along a first sidewall of the wafer processing module at a first distance from the planar surface of the wafer support assembly measured parallel to an axis normal to the planar surface of the wafer support assembly and at a determined transmission angle to a selected reflectance point, wherein the determined transmission angle is measured relative to the axis normal to the plane of the wafer support assembly when the wafer is supported by the wafer support assembly;

a signal receiver positioned along a second sidewall of the wafer processing module opposite the first sidewall and at a second distance from the planar surface of the wafer support assembly measured parallel to the axis normal to the planar surface of the wafer support assembly and at an estimated reflectance angle measured at the selected reflectance point and relative to the axis normal to the planar surface of the wafer support assembly when the wafer is supported by the wafer support assembly, and wherein the respective first and second distances are different distances determined based on the estimated reflectance angle, the determined transmission angle, and the selected reflectance point, the signal receiver further comprising;

a monitoring device to monitor for a reflected signal from the wafer at the signal receiver at the estimated reflectance angle;

a data determining device to determine an actual reflectance angle relative to an axis parallel to the planar surface of the wafer support assembly when the wafer is supported by the wafer support assembly for the reflected signal;

a data comparator to determine a difference between the determined actual reflectance angle and the estimated reflectance angle; and a generator to generate a warning indication if the comparator indicates an actual wafer tilt angle that exceeds a permitted wafer tilt angle.

15. The system of claim 14, further comprising:
a viewing assembly in the semiconductor wafer processing module to perform a visual inspection of the wafer in the module based on a generated warning indication.

16. The system of claim 14, wherein the semiconductor wafer processing module is a loadlock or loading station.

17. The system of claim 14, wherein the signal emitter is vacuum resistant and the signal receiver comprises a vacuum-resistant sensor.

18. The system of claim 14, wherein the first sidewall and the second sidewall are opposite internal sidewalls of the reaction chamber.

19. The system of claim 14, wherein the data determining device is programmed to determine the actual wafer tilt angle by:
computing a first difference between 90 degrees and the estimated reflectance angle;
computing a second difference between the determined actual reflectance angle and the computed first difference; and
dividing the computed second difference by two.

* * * * *